(12) United States Patent
Huang et al.

(10) Patent No.: US 6,434,057 B1
(45) Date of Patent: Aug. 13, 2002

(54) MEMORY DEVICE WITH A SENSE AMPLIFIER DETECTION CIRCUIT TO CONTROL AN OUTPUT BUFFER AMPLIFIER

(75) Inventors: Shih-Huang Huang; Jui-Lung Chen, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,306

(22) Filed: Aug. 16, 2001

(51) Int. Cl.[7] .................................................. G11C 7/00
(52) U.S. Cl. ..................... 365/189.05; 365/230.08; 336/82; 336/83
(58) Field of Search ................. 365/189.05, 189.01, 365/208, 230.08, 233.5; 326/82, 83

(56) References Cited

U.S. PATENT DOCUMENTS 5,046,048 A * 9/1991 Atsumi et al. ............... 365/201
5,729,502 A * 3/1998 Furntani et al. ............. 365/233
5,883,847 A * 3/1999 Takahashi .................... 365/208
5,907,509 A * 5/1999 Furutani et al. ......... 365/189.05

* cited by examiner

*Primary Examiner*—David Nelms
*Assistant Examiner*—Gene N. Auduong
(74) *Attorney, Agent, or Firm*—Winston Hsu

(57) ABSTRACT

A memory device has an output buffer. The output buffer is electrically connected to a data output port of a sense amplifier of the memory device for amplifying an output signal from the data output port. The output buffer has a detector for producing a control signal according to the output signal from the data output port, and an amplifier for amplifying the output signal from the data output port. The amplifier has an input port electrically connected to the data output port for accepting the output signal from the data output port, and a control terminal electrically connected to the output terminal of the detector for accepting the control signal from the detector to control operations of the amplifier. When the detector produces the control signal and transmits the control signal to the control terminal of the amplifier, the amplifier begins amplifying the output signal transmitted from the data output port to the input port of the amplifier.

11 Claims, 8 Drawing Sheets

MEMORY DEVICE WITH A SENSE AMPLIFIER DETECTION CIRCUIT TO CONTROL AN OUTPUT BUFFER AMPLIFIER

BACKGROUND OF INVENTION

1. Field of the Invention

The present invention relates to a memory device with an output buffer. More specifically, the present invention discloses an output buffer with an output signal that is generated from a sense amplifier.

2. Description of the Prior Art

Please refer to FIG. 1 and FIG. 2. FIG. 1 is a diagram of a memory circuit 10 according to the prior art. FIG. 2 is a diagram of a memory array 12 as shown in FIG. 1. The memory circuit 10 comprises a memory array 12, an address buffer 14, a row decoder 16, a column decoder 18, a sense amplifier 22, and an output buffer 28. The memory array 12 comprises a plurality of word lines 32, a plurality of bit lines 34 and a plurality of memory cells 36. Each of the memory cells 36 is coupled to a corresponding word line 32 and a corresponding bit line 34, and is used for storing one binary bit of data.

When data stored in one of the memory cells 36 is to be accessed, a corresponding address signal ADRS is transmitted to the memory circuit 10, and the memory circuit 10 then outputs a corresponding data output signal Dout. The address buffer 14 transforms the address signal ADRS, transmitted from an input terminal of the memory circuit 10, into two address signals AX and AY. The address signals AX and AY are then sent to the row decoder 16 and the column decoder 18, respectively. The row decoder 16 selects a corresponding word line 32 according to the address signal AX, and the column decoder 18 selects a corresponding bit line 34 according to the address signal AY. In this manner, the memory cell 36 corresponding to the address signal ADRS outputs a corresponding data signal to the sense amplifier 22 according to the data stored within this cell 36. The sense amplifier 22 amplifies the data signal outputted from the memory cell 36 to determine if the data stored in the memory cell 36 is a binary "1" or "0", and thereby generates an output signal SA/SAB. The output signal SA/SAB comprises two complementary voltage signals SA and SAB. When the voltage signal SA is a high voltage, the voltage signal SAB is a low voltage, and vice versa, when the voltage signal SA is a low voltage, then the voltage signal SAB is a high voltage. The output signal SA/SAB is transmitted from a data output port 38 of the sense amplifier 22 to the output buffer 28, which has a control terminal 42 for accepting a control signal OE. When the control signal OE is high, the output buffer 28 amplifies the output signal SA/SAB to generate the data output signal Dout, and when the control signal OE is low, the output buffer 28 does not amplify the output signal SA/SAB.

While the represented data of the output signal SA/SAB is in an undefined state, the memory circuit 10 utilizes an address transition detector (ATD) 24 and a delay circuit 26 for producing the control signal OE so as to control the output of the output buffer, thus preventing an undefined output signal SA/SAB from being amplified by the output buffer 28, which could otherwise adversely affect the accuracy of the data output signal Dout. The address transition detector 24 is used to detect variations of the address signals AX and AY to generate a control signal ADT. The delay circuit 26 is used to delay the control signal ADT for a predetermined time interval, and the signal outputted from the delay circuit 26 is the control signal OE.

Please refer to FIG. 3, which is a timing diagram of signals generated in the memory circuit 10. The output signal SA/SAB is represented, respectively, by two complementary voltage signals SA and SAB. Data outputted from the memory cell 36 is a "1" when the voltage signal SA is greater than a first predetermined high voltage VH1 and the voltage signal SAB is smaller than a first predetermined low voltage VL1 (an interval T2 as shown in FIG. 3). The data outputted from the memory cell 36 is a "0" when the voltage signal SA is smaller than the first predetermined low voltage VL1 and the voltage signal SAB is greater than the first predetermined high voltage VH1 (an interval T4 as shown in FIG. 3). The data outputted from the memory cell 36 is undefined when any one of the voltage signals SA or SAB is between the first predetermined high voltage VH1 and the first predetermined low voltage VL1 (intervals T1 and T3 as shown in FIG. 3).

As shown in FIG. 3, when the control signal OE rises from a second predetermined low voltage VL2 to a second predetermined high voltage VH2, the output buffer 28 amplifies the output signal SA/SAB and generates the data output signal Dout. When the control signal OE drops from the second predetermined high voltage VH2 to the second predetermined low voltage VL2, the output buffer 28 stops amplifying the output signal SA/SAB. The amplitude of the data output signal Dout varies between a third predetermined high voltage VH3 and a third predetermined low voltage VL3, and the outputted data of the memory circuit 10 is a "1" or a "0" according to the amplitude of the output signal Dout, which is output from the output buffer 28. When the amplitude of the output signal Dout equals the third predetermined high voltage VH3, the outputted data is a "1". When the amplitude of the output signal Dout equals the third predetermined low voltage VL3, the outputted data is a "0". When the control signal OE drops from the second predetermined high voltage VH2 to the second predetermined low voltage VL2, i.e., when the output buffer 28 stops amplifying the output signal SA/SAB, the amplitude of the output signal Dout will be a middle voltage VM regardless of whether the amplitude of the output signal Dout should be equal to the predetermined third high voltage VH3 or the predetermined third low voltage VL3. The middle voltage VM is approximately equal to the average of VH3 and VL3, i.e, VM (VH3+VL3)/2.

Although the desired time interval of the delayed control signal ATD from the delay circuit 26 is determined before manufacturing the memory circuit 10, the actual delay time interval of the delay circuit 26 varies with an operating temperature of the memory circuit 10, or due to manufacturing processes of the memory circuit 10. When the variation of the delayed time interval exceeds a predetermined range, the speed and accuracy of the memory circuit 10 will be affected. If the delayed time interval of the delay circuit 26 is longer, the accessing speed of the memory circuit 10 is reduced. As shown in FIG. 3, when the represented data of the output signal SA/SAB has confirmed and past a predetermined time interval Tout, the control signal OE rises to the second predetermined high voltage VH2, and the output buffer 28 begins amplifying the output signal SA/SAB. When the delayed time interval of the delay circuit 26 is longer, the predetermined time interval Tout is also longer, so the accessing time interval of the memory circuit 10 is longer, which causes the accessing speed to become slower. On the other hand, when the delayed time interval of the delay circuit 26 is shorter, the accessing speed of the memory circuit 10 becomes faster. However, the memory circuit 10 will more easily generate errors during the data accessing process if the delayed time interval of the delay circuit 26 is too short.

Please refer to FIG. 4, which is a timing diagram of signals generated in the memory circuit 10 when a data accessing error occurs. As shown in FIG. 4, when the presented data of the output signal SA/SAB is undefined, that is, when any one of the voltage signals SA or SAB is between the first predetermined high voltage VH1 and the first predetermined low voltage VL1, the control signal OE rises from the second predetermined low voltage VL2 to the second predetermined high voltage VH2. In the data translation process of the output signal SA/SAB from a "0" to a "1" (an interval T5 as shown in FIG. 4), at a time point Ta, the data of the output signal SA/SAB are interpreted as a "0", so that the data output signal Dout drops from the middle voltage VM. At the time point Tb, the data of the output signal SA/SAB are interpreted as a "1", so that the data output signal Dout rises to the third predetermined high voltage VH3. On the other hand, in the translation process of the data of the output signal SA/SAB from a "1" to a "0" (an interval T6 as shown in FIG. 4), at a time point Tc, the data of the output signal SA/SAB are interpreted as a "1", so that the data output signal Dout rises from the middle voltage VM. At a time point Td, the data of the output signal SA/SAB are interpreted as a "0", so that the data output signal Dout drops to the third predetermined low voltage VL3. As mentioned above, when the presented data of the data output signal Dout is undefined, if the output buffer 28 begins amplifying the output signal SA/SAB, the data output signal SA/SAB generated from the output buffer 28 will produce the above-mentioned phenomena that adversely affects the accuracy of the data when accessing the memory circuit 10.

SUMMARY OF INVENTION

It is therefore a primary objective of the present invention to provide a memory circuit with an output buffer for controlling control signals of the output buffer so as to improve an accessing speed of the memory circuit, according to output signals generated from a sense amplifier.

The present invention discloses a memory device having an output buffer. The output buffer is electrically connected to a data output port of a sense amplifier of the memory device for amplifying an output signal from the data output port. The output buffer has a detector for producing a control signal according to the output signal from the data output port, and an amplifier for amplifying the output signal from the data output port. The amplifier has an input port electrically connected to the data output port for accepting the output signal from the data output port, and a control terminal electrically connected to the output terminal of the detector for accepting the control signal from the detector to control operations of the amplifier. When the detector produces the control signal and transmits the control signal to the control terminal of the amplifier, the amplifier begins amplifying the output signal transmitted from the data output port to the input port of the amplifier.

It is an advantage of the present invention that the memory circuit having an output buffer generates the control signal for controlling operations of the output buffer according to the amplitude of the output signal outputted from the sense amplifier, so when data of the output signal outputted from the sense amplifier are defined, the output buffer begins operating, and the accessing speed of the memory circuit is increased.

These and other objectives and advantages of the present invention will no doubt become obvious to those of ordinary skill in the art after reading the following detailed description of the preferred embodiment that is illustrated in the various figures and drawings.

DETAILED DESCRIPTION

Figure 1:
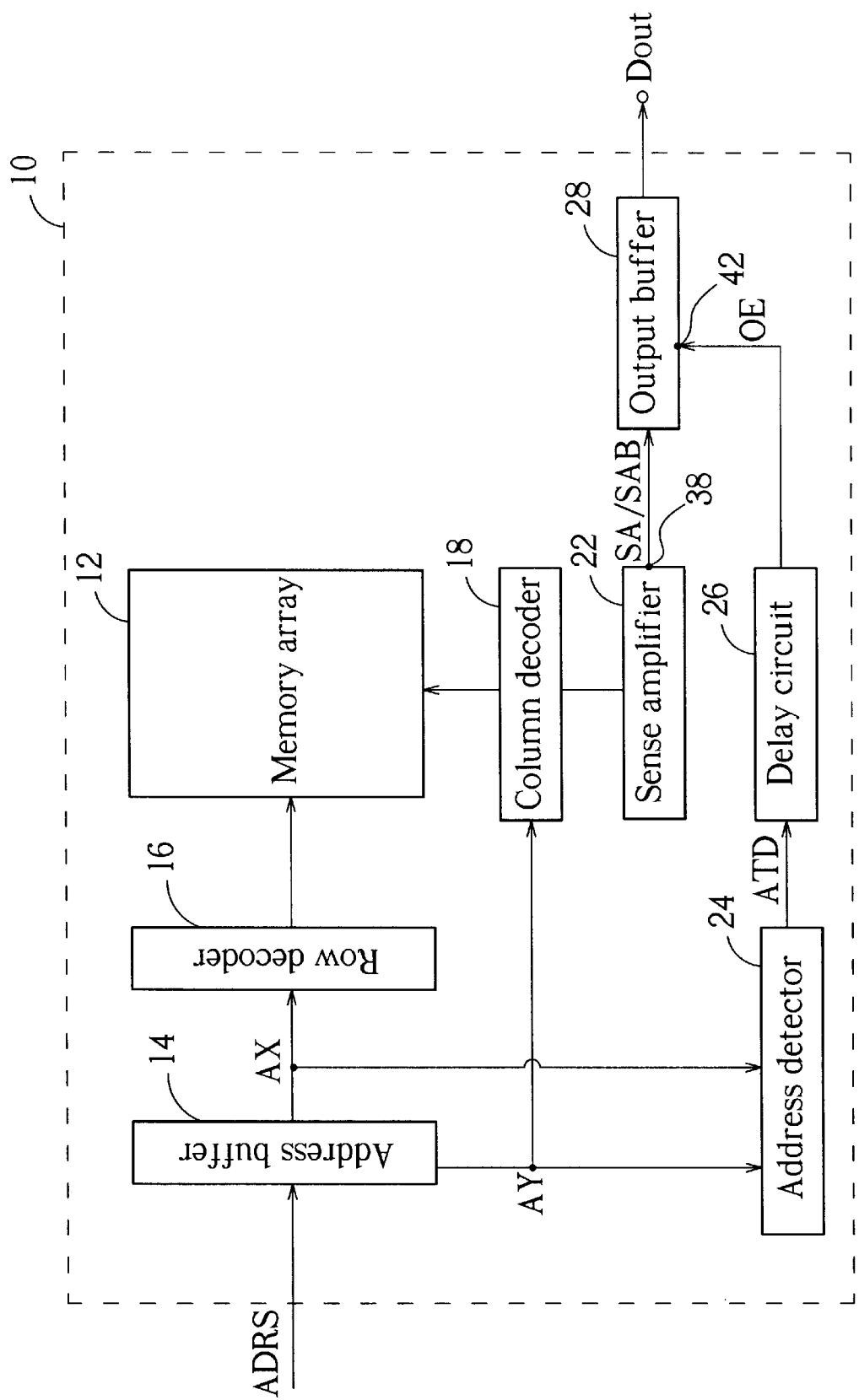
FIG. 1 is a diagram of a memory circuit according to the prior art.
Figure 2:
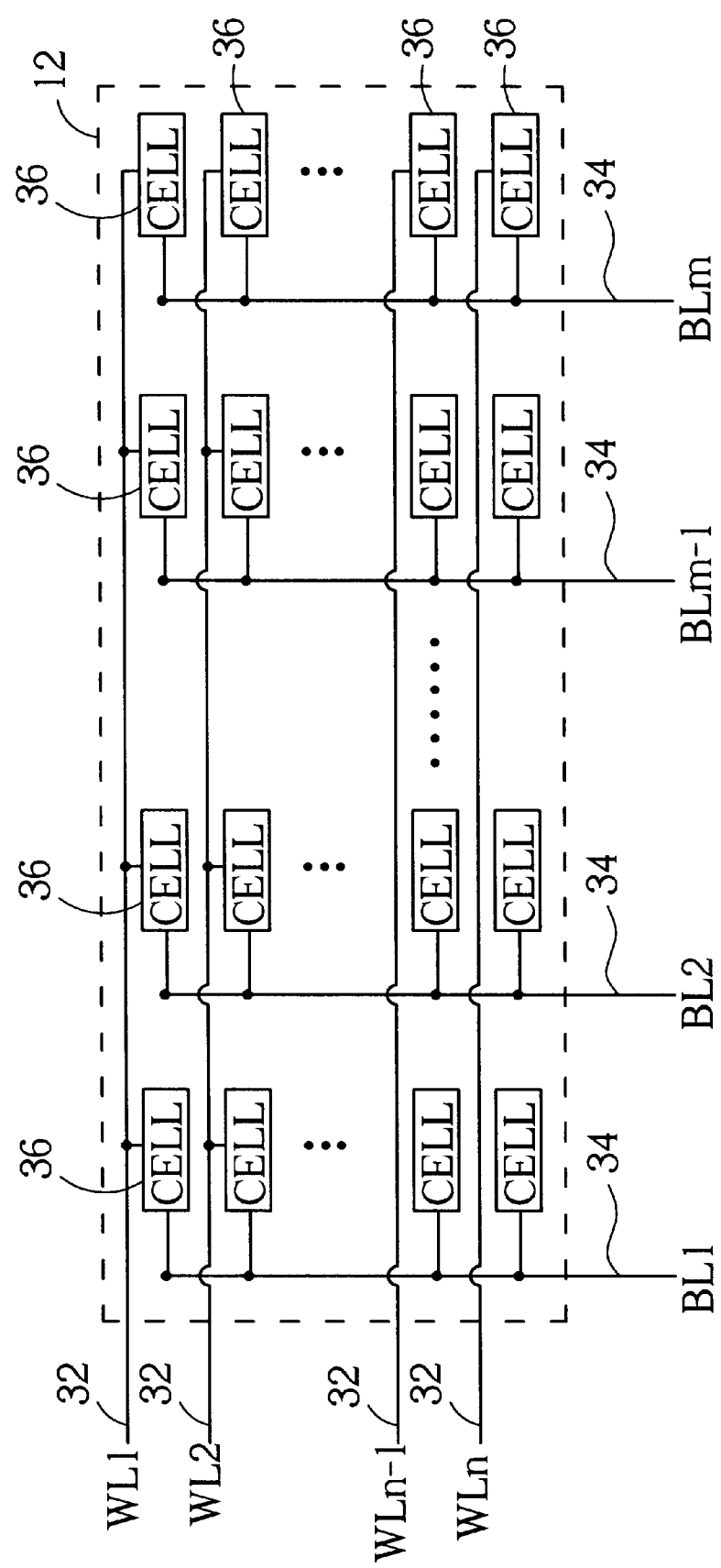
FIG. 2 is a diagram of a memory array as shown in FIG. 1.
Figure 3:
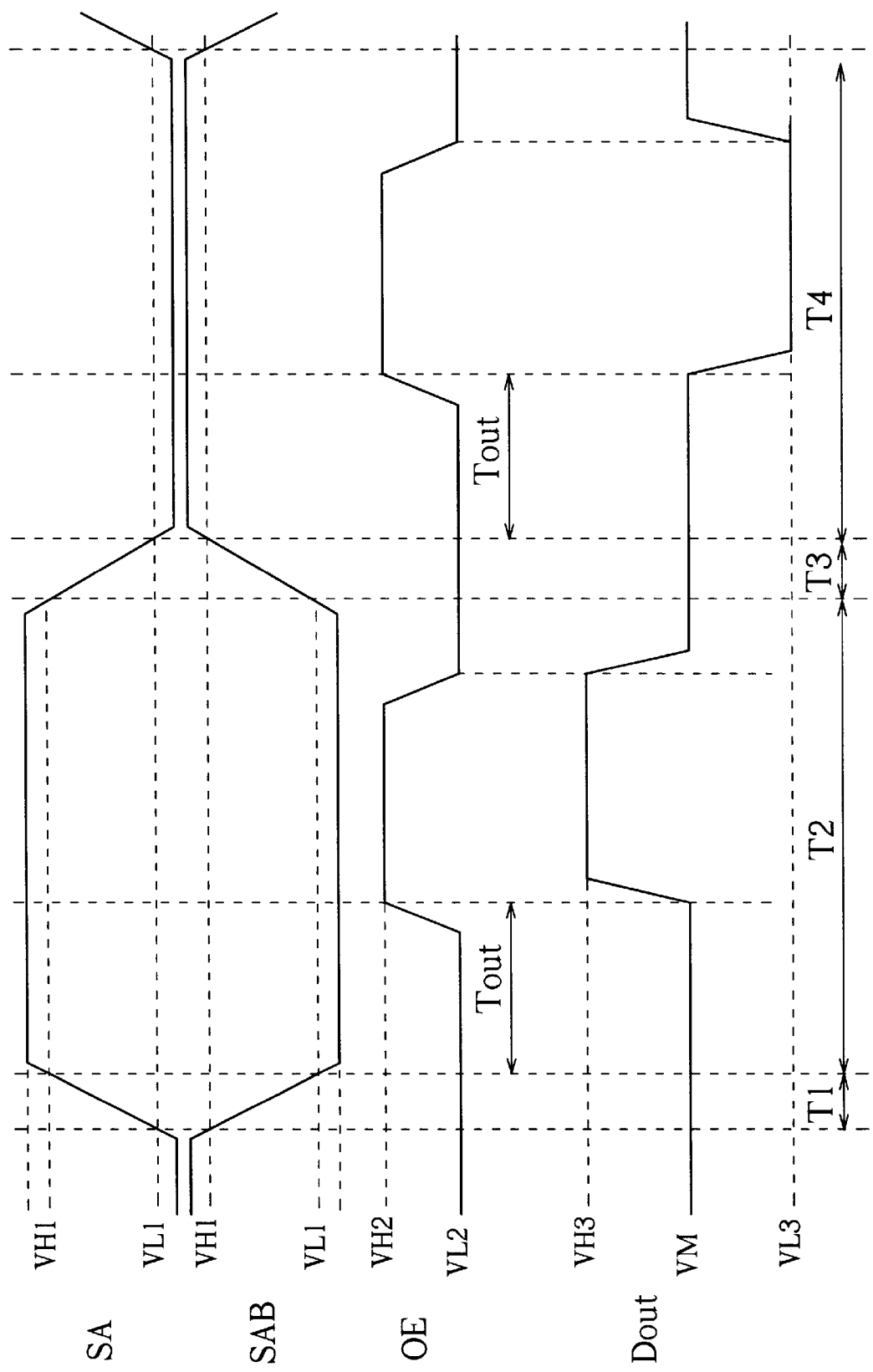
FIG. 3 is a timing diagram of signals generated from the memory circuit of FIG. 1.
Figure 4:
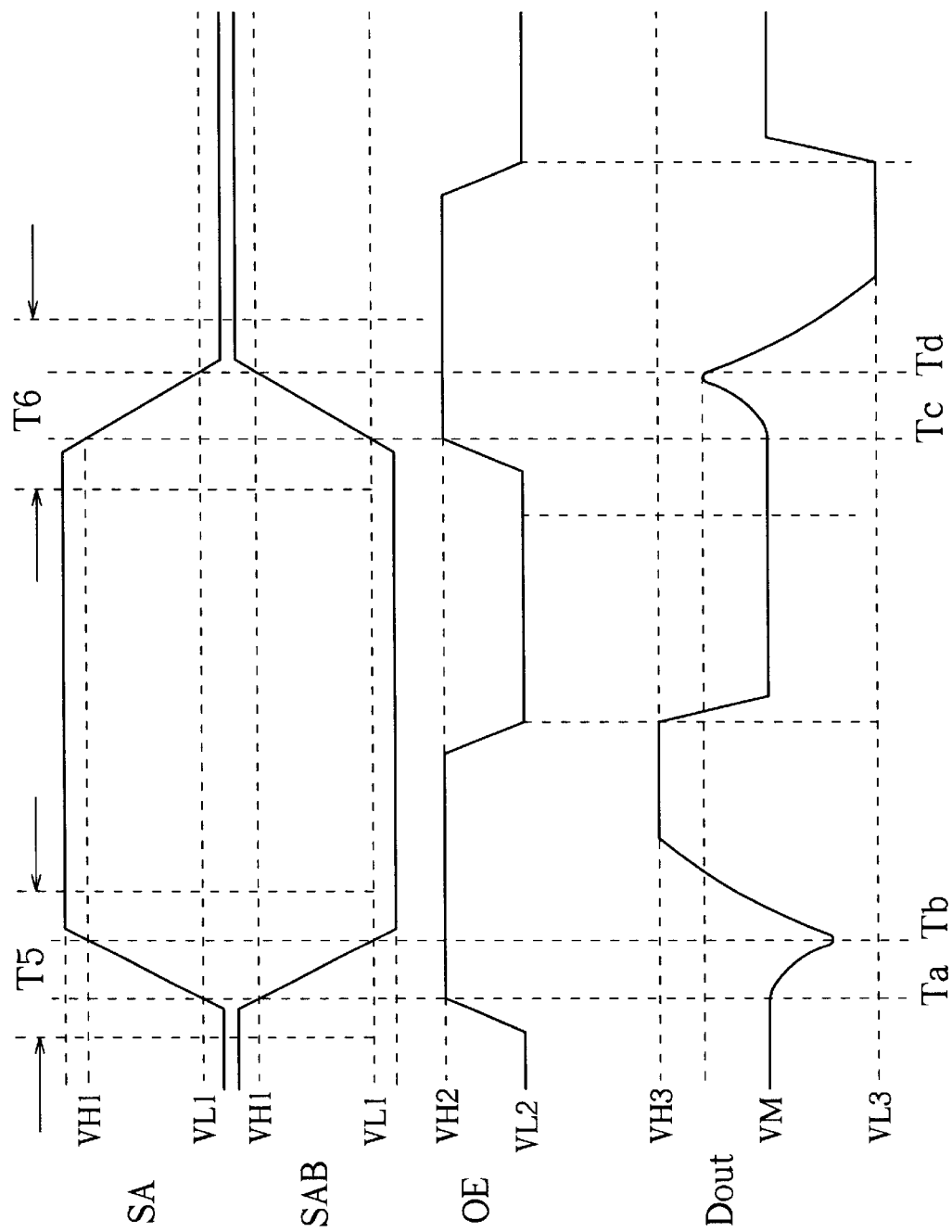
FIG. 4 is a timing diagram of signals generated from the memory circuit of FIG. 1 when a data accessing error occurs.
Figure 5:
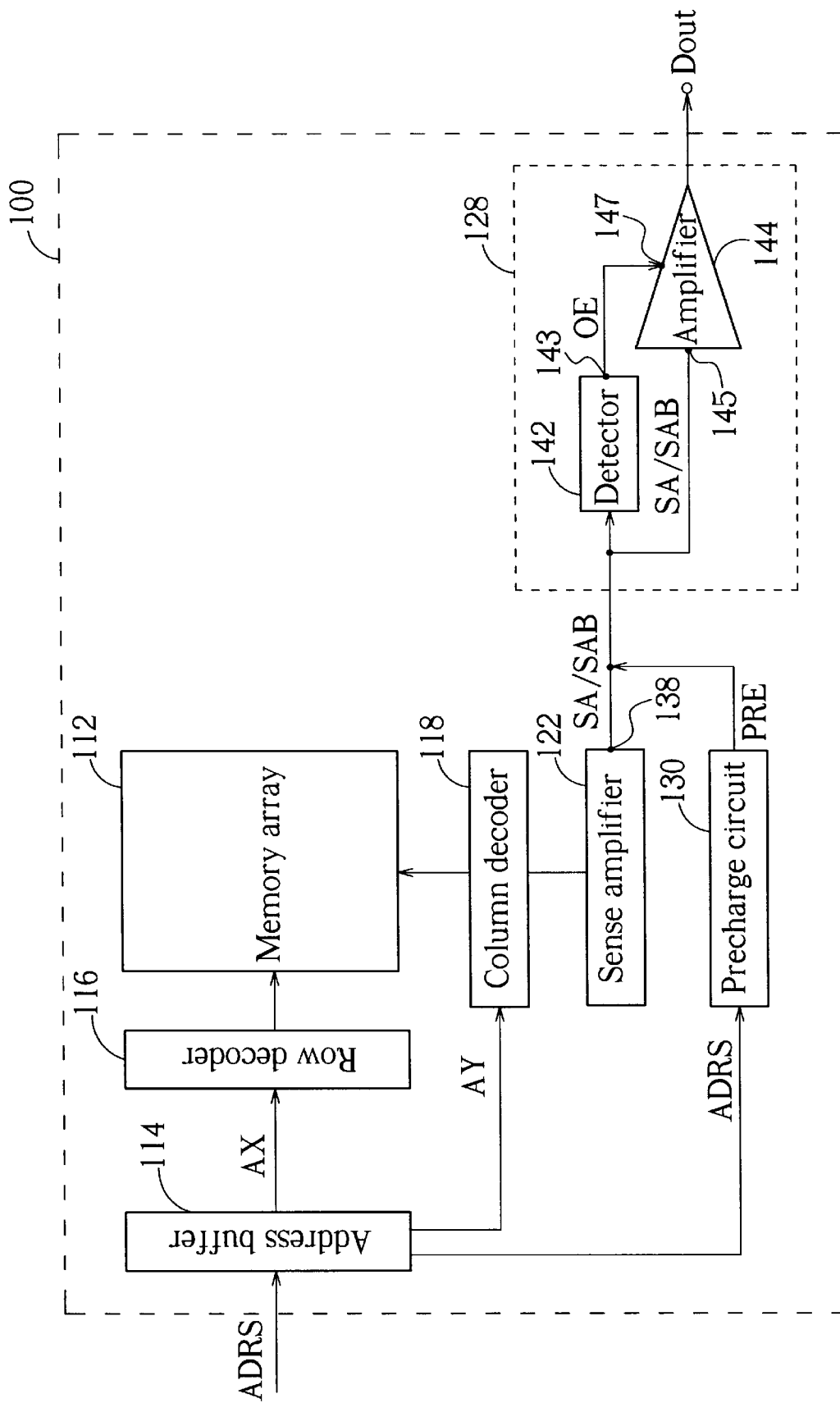
FIG. 5 is a diagram of a memory circuit according to the present invention.
Figure 6:
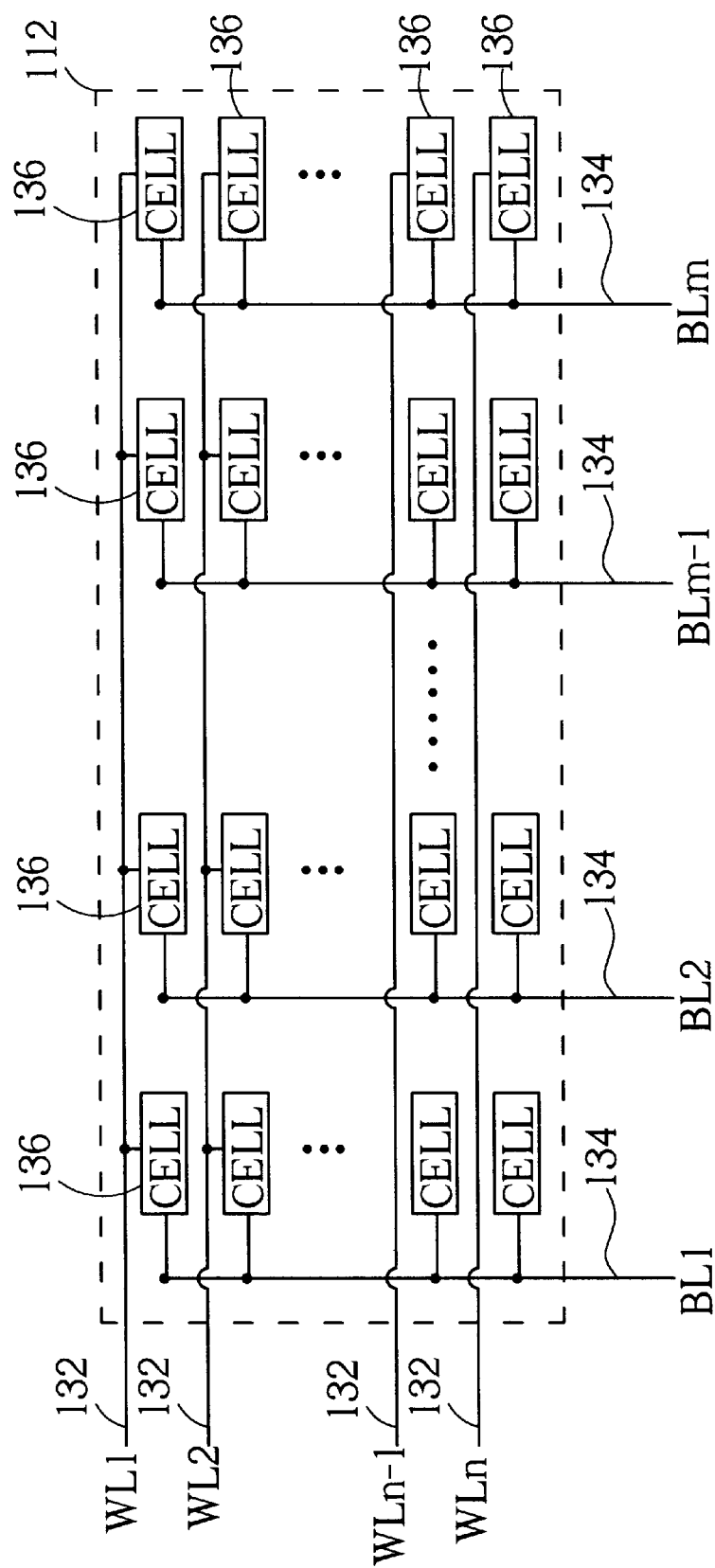
FIG. 6 is a diagram of a memory array of FIG. 5.

Please refer to FIG. 5 and FIG. 6. FIG. 5 is a diagram of a memory circuit 100 according to the present invention. FIG. 6 is a diagram of a memory array 112 depicted in FIG. 5. The memory circuit 100 comprises the memory array 112, an address buffer 114, a row decoder 116, a column decoder 118, a sense amplifier 122, an output buffer 128, and a pre-charge circuit 130. The memory array 112 comprises a plurality of word lines 132, a plurality of bit lines 134 and a plurality of memory cells 136. Each of the memory cells 136 is coupled to a corresponding word line 132 and a corresponding bit line 134, and is used to store one bit of binary data.

When data stored in one of the memory cells 136 is accessed, a corresponding address signal ADRS is transmitted to the memory circuit 100, and the memory circuit 100 outputs a corresponding data output signal Dout. The address buffer 114 transforms the address signal ADRS, transmitted from an input terminal of the memory circuit 100, into two address signals AX and AY. The address signals AX and AY are then sent to the row decoder 116 and the column decoder 118, respectively. The row decoder 116 selects a corresponding word line 132 according to the address signal AX, and the column decoder 118 selects a corresponding bit line 134 according to the address signal AY. A memory cell 136 corresponding to the address signal ADRS thus outputs a corresponding data signal to the sense amplifier 122 according to the data stored in this memory cell 136. The sense amplifier 122 senses and amplifies the data signal outputted from the memory cell 136 to determine if the data stored in the memory cell 36 is a "1" or a "0", and generates a corresponding output signal SA/SAB. The output signal SA/SAB comprises two complementary voltage signals SA and SAB.

The output buffer 128 comprises a detector 142 and an amplifier 144. The detector 142 is electrically connected to the data output port 138 of the sense amplifier 122, and produces a control signal OE according to the output signal SA/SAB from the data output port 138. The amplifier 144 is electrically connected to the data output port 138 and an output terminal 143 of the detector 142, and amplifies the output signal SA/SAB from the data output port 138. The amplifier 144 comprises an input port 145 electrically connected to the data output port 138, which accepts the output signal SA/SAB from the data output port 138, and a control terminal 147 electrically connected to the output terminal 143 of the detector 142, which accepts a control signal OE from the detector 142 to control operations of the amplifier 144. When the detector 142 produces the control signal OE and transmits the control signal OE to the control terminal 147 of the amplifier 144, the amplifier 144 begins amplifying the output signal SA/SAB transmitted from the data output port 138, and thereby generates a data output signal Dout. When the control signal OE is high, the output buffer 128 amplifies the output signal SA/SAB outputted from the data output port 138 to generate the data output signal Dout. When the control signal OE is low, the output buffer 128 stops amplifying the output signal SA/SAB. The pre-charge circuit 130 of the memory circuit 100 is used to detect variations of the address signal ADRS to generate a pre-charge signal PRE. An output terminal of the pre-charge circuit 130 is electrically connected to the data output port 138 of the sense amplifier 122. When the address signal ADRS varies, the pre-charge circuit 130 generates the pre-charge signal PRE raise the two voltage signals SA and SAB of the output signal SA/SAB to high voltages, and further reduces the control signal OE to a low voltage so as to cause the output buffer 128 to stop amplifying the output signal SA/SAB.

Figure 7:
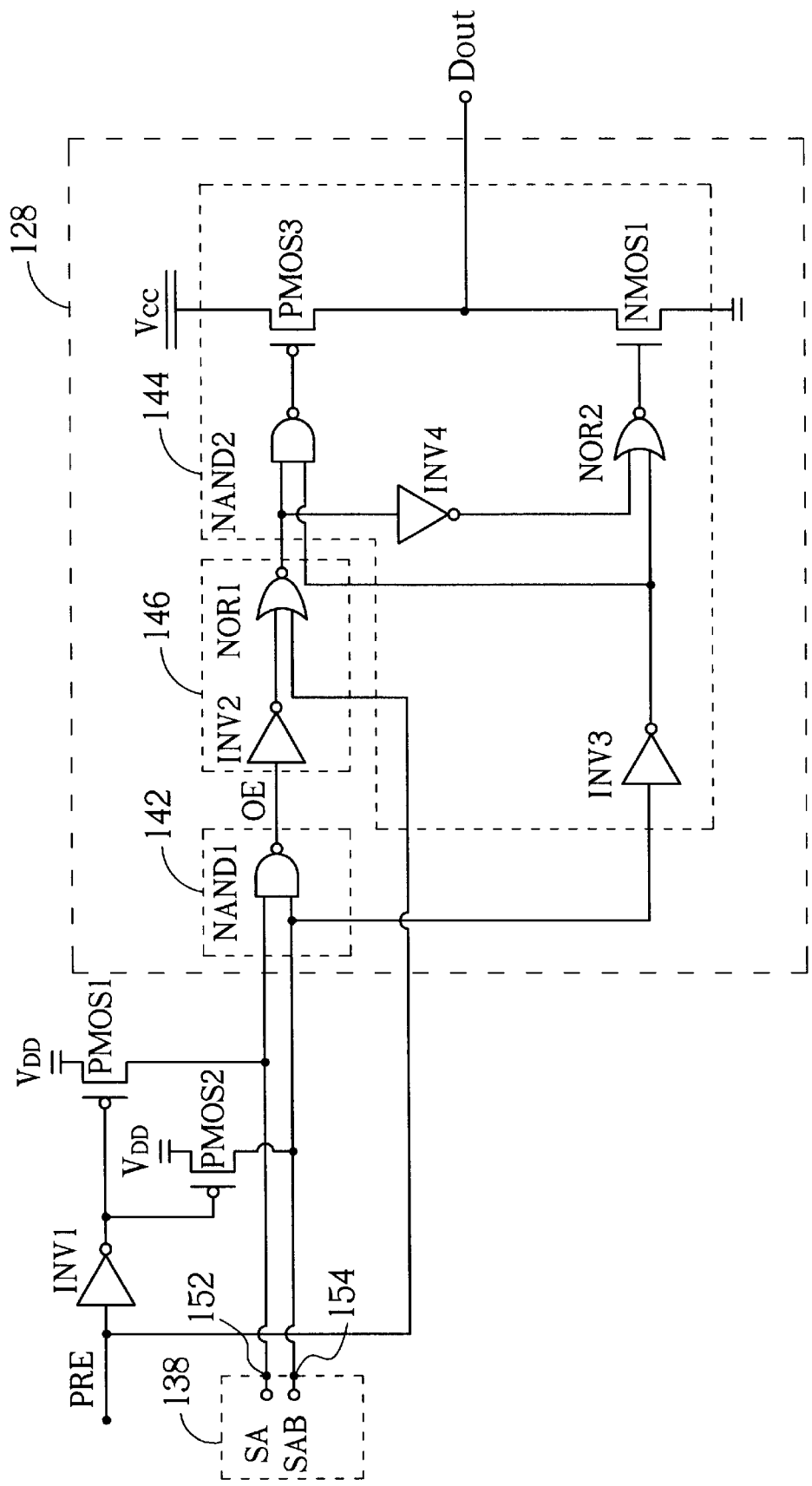
FIG. 7 is a circuit diagram of an output buffer of FIG. 5.

Please refer to FIG. 7, which is a circuit diagram of the output buffer 128. The output buffer 128 is electrically connected to the data output port 138. The data output port 138 comprises a first output terminal 152 for outputting the voltage signal SA, and a second output terminal 154 for outputting the voltage signal SAB. The detector 142 is electrically connected to the first output terminal 152 and the second output terminal 154 to produce the control signal OE according to the output signals SA and SAB outputted from the first output terminal 152 and the second output terminal 154. The pre-charge circuit 130 is also electrically connected to the first output terminal 152 and the second output terminal 154. When the address signal ADRS varies, the pre-charge signal PRE generated from the pre-charge circuit 130 is high (i.e., a high voltage), and the pre-charge signal PRE is transmitted to two P-type metal-oxide semiconductor transistors PMOS1 and PMOS2 via an inverter INV1. Hence, when the address signal ADRS varies, the transistors PMOS1 and PMOS2 become conductive, and the voltage signals SA and SAB outputted from the first output terminal 152 and the second output terminal 154, respectively, are raised to high voltages (i.e., go high). The output buffer 128 further comprises a delay circuit 146 electrically connected between the detector 142 and the amplifier 144 for delaying the control signal OE from the detector 142.

As shown in FIG. 7, the detector 142 is composed of a NAND gate NAND1, and the delay circuit 146 is composed of an inverter INV2 and a NOR gate NOR1. The amplifier 144 comprises two inverters INV3 and INV4, a NAND gate NAND2, a NOR gate NOR2, a P-type metal-oxide semiconductor transistor PMOS3, and an N-type metal-oxide semiconductor transistor NMOS1. When the voltage signal SA is high and the voltage signal SAB is low, the transistor PMOS3 conducts and the transistor NMOS1 does not conduct, so a voltage of the data output signal Dout raises to Vcc. When the voltage signal SA is low and the voltage signal SAB is high, the transistor PMOS3 is does not conduct and the transistor NMOS1 conducts, so the voltage of the data output signal Dout drops to zero. When the voltage signals SA and SAB are both high, the transistor PMOS3 and the transistor NMOS1 do not conduct, so the voltage of the data output signal Dout becomes Vcc/2.

Figure 8:
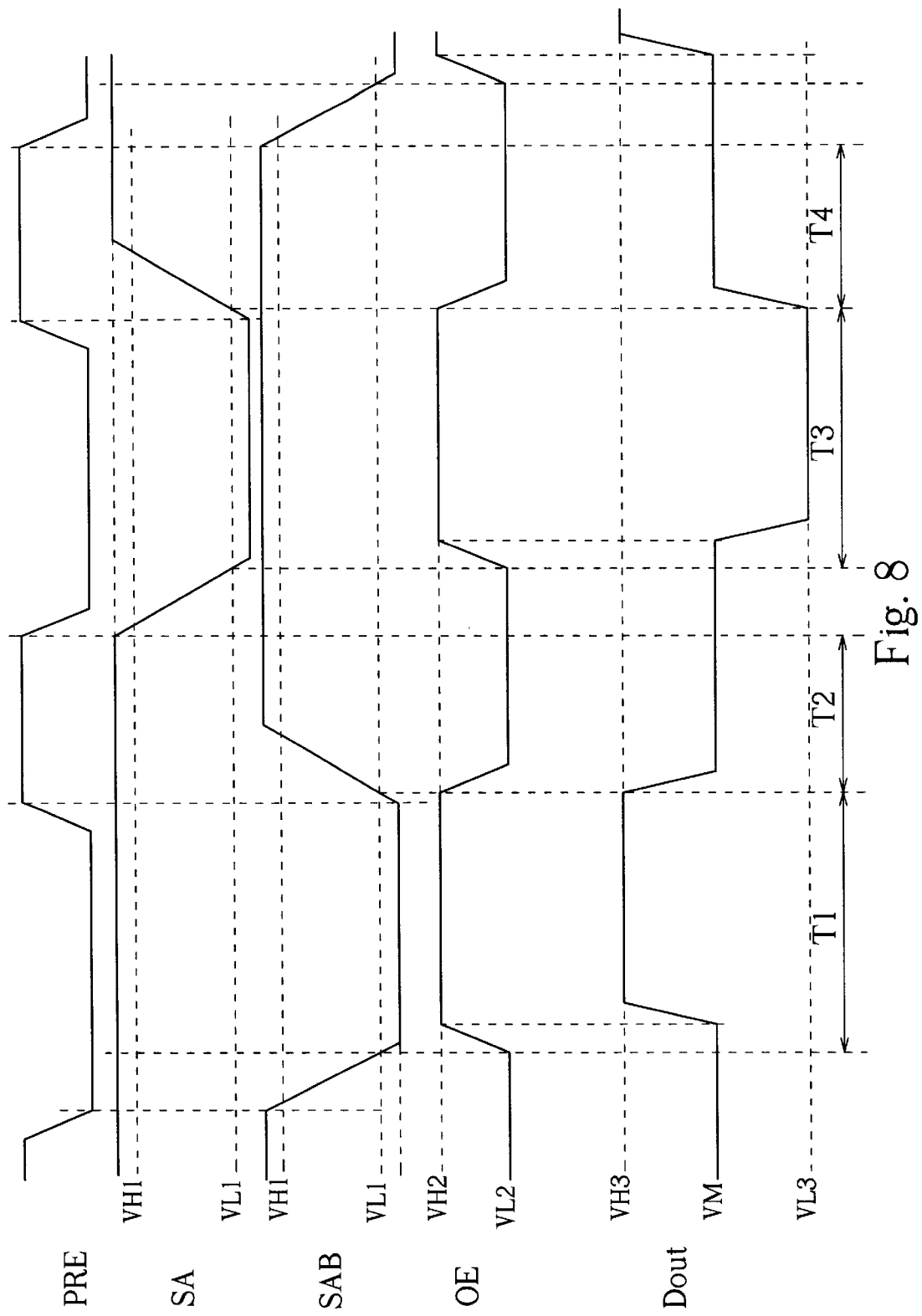
FIG. 8 is a timing diagram of signals generated from the memory circuit of FIG. 5.

Please refer to FIG. 8, which is a timing diagram of signals generated in the memory circuit 100. The output signal SA/SAB is represented, respectively, by the two complementary voltage signals SA and SAB. Data outputted from the memory cell 136 is a "1" when the voltage signal SA is greater than a first predetermined high voltage VH1 and the voltage signal SAB is smaller than a first predetermined low voltage VL1 (in an interval T1 as shown in FIG. 8). The detector 142 raises the control signal OE from a second predetermined low voltage VL2 to a second predetermined high voltage VH2, and the amplifier 144 thus begins amplifying the output signal SA/SAB so as to increase the data output signal Dout from a middle voltage VM to a third predetermined high voltage VH3. The data outputted from the memory cell 136 is a "0" when the voltage signal SA is smaller than the first predetermined low voltage VL1 and the voltage signal SAB is greater than the first predetermined high voltage VH1 (in an interval T3 as shown in FIG. 8). The detector 142 raises the control signal OE from the second predetermined low voltage VL2 to the second predetermined high voltage VH2, and the amplifier 144 thus begins amplifying the output signal SA/SAB so as to drop the data output signal Dout from the middle voltage VM to a third predetermined low voltage VL3. When the address signal ADRS varies, the pre-charge circuit 130 raises the pre-charge signal PRE from low to high (intervals T2 and T4 as shown in FIG. 8). The voltage signals SA and SAB are both raised to the first predetermined high voltage VH1, and the control signal OE drops from the second predetermined high voltage VH2 to the second predetermined low voltage VL2. The amplifier 144 thus stops amplifying the output signal SA/SAB, and the data output signal Dout is set to the middle voltage VM. An amplitude of the data output signal Dout varies between the third predetermined high voltage VH3 and the third predetermined low voltage VL3, and the outputted data of the memory circuit 100 functioning as a "1" or a "0" is determined by the amplitude of the output signal Dout outputted from the output buffer 128. When the amplitude of the output signal Dout is equal to the third predetermined high voltage VH3, the outputted data functions as a "1". When the amplitude of the output signal Dout is equal to the third predetermined low voltage VL3, the outputted data functions as a "0". The middle voltage VM is approximately equal to (VH3+VL3)/2, and the third predetermined high voltage VH3 is several times the value of the first predetermined high voltage VH1.

In contrast to the prior art, the present invention memory circuit has an output buffer that generates the control signal for controlling operations of the output buffer according to the amplitude of the output signal outputted from the sense amplifier. Hence, when data of the output signal outputted from the sense amplifier are interpreted, the output buffer begins operating, and the accessing speed of the memory circuit is increased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A memory device comprising:
   a memory-array having a plurality of word lines, a plurality of bit lines, and a plurality of memory cells, each of the memory cells being coupled to a corresponding word line and a corresponding bit line and being used for storing one bit of data binary;
   a sense amplifier electrically connected to the memory array for sensing and amplifying data signals outputted from each of the memory cells to generate an output signal at a data output port of the sense amplifier;

an output buffer electrically connected to the data output port of the sense amplifier for amplifying the output signal from the data output port, the output buffer comprising:

a detector having an output terminal, the detector electrically connected to the data output port for producing a control signal at the output terminal according to the output signal from the data output port; and an amplifier electrically connected to the data output port and to the output terminal of the detector for amplifying the output signal from the data output port, the amplifier comprising:

an input port electrically connected to the data output port for accepting the output signal from the data output port; and a control terminal electrically connected to the output terminal of the detector for a accepting the control signal from the detector to control operations of the amplifier;

wherein when the detector produces the control signal and transmits the control signal to the control terminal of the amplifier, the amplifier begins amplifying the output signal transmitted from the data output port of the sense amplifier to the input port of the amplifier.

2. The memory device of claim 1 wherein the data output port comprises a first output terminal and a second output terminal, and the detector is electrically connected to the first output terminal and the second output terminal for producing the control signal according to the output signal from the first output terminal and the second output terminal.

3. The memory device of claim 2 wherein when one of the first output terminal and the second output terminal outputs a high voltage that is greater than a predetermined high voltage, and the other output terminal outputs a low voltage that is less than a predetermined low voltage, the low voltage being less than the high voltage, the detector is enabled to produce the control signal.

4. The memory device of claim 1 wherein the output buffer further comprises a delay circuit electrically connected between the detector and the amplifier for delaying the control signal from the detector.

5. The memory device of claim 1 further comprising a row decoder electrically connected to the word lines, and a column decoder electrically connected to the bit lines, the memory device being capable of controlling each of the memory cells to transmit the data signals to the sense amplifier according the one bit of binary data stored in the memory cell via the row decoder and the column decoder.

6. An output buffer electrically connected to a data output port of a sense amplifier of a memory device for amplifying an output signal from the data output port, the output buffer comprising:

a detector having an output terminal, the detector electrically connected to the data output port for producing a control signal at the output terminal according to the output signal from the data output port; and an amplifier electrically connected to the data output port and to the output terminal of the detector for amplifying the output signal from the data output port, the amplifier comprising:

an input port electrically connected to the data output port for accepting the output signal from the data output port; and a control terminal electrically connected to the output terminal of the detector for accepting the control signal from the detector to control operations of the amplifier;

wherein when the detector produces the control signal and transmits the control signal to the control terminal of the amplifier, the amplifier begins amplifying the output signal transmitted from the data output port to the input port of the amplifier.

7. The output buffer of claim 6 wherein the data output port comprises a first output terminal and a second output terminal, and the detector is electrically connected to the first output terminal and the second output terminal for producing the control signal according to the output signal from the first output terminal and the second output terminal.

8. The output buffer of claim 7 wherein when one of the first output terminal and the second output terminal outputs a high voltage which is greater than a predetermined high voltage, and the other output terminal outputs a low voltage which is less than a predetermined low voltage, the low voltage being less than the high voltage, the detector is enabled to produce the control signal.

9. The output buffer of claim 6 further comprising a delay circuit electrically connected between the detector and the amplifier for delaying the control signal from the detector.

10. The output buffer of claim 6 wherein the memory device further comprising a memory array having a plurality of word lines, a plurality of bit lines, and a plurality of memory cells, each of the memory cells being coupled to a corresponding word line and a corresponding bit line and being used for storing one bit of data, the sense amplifier being electrically connected to the memory array for amplifying data signals outputted from each of the memory cells to generate the output signal transmitted to the output buffer.

11. The output buffer of claim 10 wherein the memory device further comprising a row decoder electrically connected to the word lines, and a column decoder electrically connected to the bit lines, the memory device being capable of controlling each of the memory cells to transmit the data signals to the sense amplifier according the one binary bit of data stored in the memory cell via the row decoder and the column decoder.

* * * * *